(12) United States Patent
den Besten et al.

(10) Patent No.: US 10,985,759 B2
(45) Date of Patent: Apr. 20, 2021

(54) APPARATUSES AND METHODS INVOLVING A SEGMENTED SOURCE-SERIES TERMINATED LINE DRIVER

(71) Applicant: NXP B.V., Eindhoven (NL)

(72) Inventors: Gerrit Willem den Besten, Eindhoven (NL); Niraj Kumar, Eindhoven (NL)

(73) Assignee: NXP B.V., Eindhoven (NL)

( * ) Notice: Subject to any disclaimer, the term of this patent is extended or adjusted under 35 U.S.C. 154(b) by 41 days.

(21) Appl. No.: 16/456,236

(22) Filed: Jun. 28, 2019

(65) Prior Publication Data
US 2020/0412368 A1    Dec. 31, 2020

(51) Int. Cl.
H03K 19/0185    (2006.01)
H03M 9/00    (2006.01)
G11C 8/08    (2006.01)

(52) U.S. Cl.
CPC ....... H03K 19/018514 (2013.01); G11C 8/08 (2013.01); H03K 19/01855 (2013.01); H03M 9/00 (2013.01)

(58) Field of Classification Search
None
See application file for complete search history.

(56) References Cited

U.S. PATENT DOCUMENTS

| | | |
|---|---|---|
| 5,598,545 A | 1/1997 | Childers et al. |
| 5,603,013 A | 2/1997 | Ohara |
| 6,215,816 B1 | 4/2001 | Gillespie et al. |
| 7,511,530 B1 * | 3/2009 | Cox ..................... H03K 17/693 326/30 |
| 8,631,483 B2 | 1/2014 | Soni et al. |
| 9,083,784 B2 | 7/2015 | Ku et al. |
| 9,455,713 B1 * | 9/2016 | Kadkol ......... H03K 19/018514 |
| 10,747,538 B2 | 8/2020 | Mouchel La Fosse et al. |
| 2002/0124007 A1 | 9/2002 | Zhao |
| 2011/0096930 A1 | 4/2011 | Walmsley |
| 2013/0002290 A1 * | 1/2013 | Gondi ................... H04L 7/0037 326/30 |
| 2013/0106491 A1 * | 5/2013 | Ryu ...................... G11C 16/08 327/407 |

(Continued)

FOREIGN PATENT DOCUMENTS

JP    2015 035780 A    2/2015

OTHER PUBLICATIONS

Non-Final Rejection for U.S. Appl. No. 16/457,287, 6 pgs. (dated Nov. 13, 2020).

(Continued)

*Primary Examiner* — Cassandra F Cox
(74) *Attorney, Agent, or Firm* — Rajeev Madnawat

(57) ABSTRACT

An example apparatus includes a line driver and an interface circuit. The line driver has a plurality of source-series terminated (SST) driver segments including switching circuitry to selectively switch among at least three voltage-reference levels to drive an output node, common to each of the SST driver segments, in response to received digital signals by switching at a rate that is faster than a baud rate characterizing the received digital signals. The interface circuit drives a transmission link, in response to a drive signal at the output node, with an analog signal representing an oversampling of the received digital signals.

20 Claims, 5 Drawing Sheets

(56) References Cited

U.S. PATENT DOCUMENTS

| | | | |
|---|---|---|---|
| 2014/0181845 A1* | 6/2014 | Jing | G06F 13/102 719/321 |
| 2019/0104088 A1 | 4/2019 | Qin et al. | |
| 2019/0205244 A1 | 7/2019 | Smith | |
| 2019/0361708 A1 | 11/2019 | Soe et al. | |
| 2020/0201637 A1 | 6/2020 | Mouchel La Fosse et al. | |
| 2020/0272474 A1 | 8/2020 | Gabor et al. | |
| 2020/0409706 A1 | 12/2020 | den Besten | |
| 2020/0409884 A1 | 12/2020 | den Besten | |
| 2020/0409976 A1 | 12/2020 | den Besten | |
| 2020/0412572 A1 | 12/2020 | den Besten | |

OTHER PUBLICATIONS

U.S. Appl. No. 16/456,467, filed Jun. 28, 2019, entitled: Apparatuses and Methods Involving Selective Disablement of Side Effects Caused by Accessing Register Sets. The Examiner is referred to the copending patent prosecution of the common Applicant (no attachment).

U.S. Appl. No. 16/456,111, filed Jun. 28, 2019, entitled: Apparatuses and Methods Involving First Type of Transaction Registers Mapped to Second Type of Transaction Addresses. The Examiner is referred to the copending patent prosecution of the common Applicant (no attachment).

U.S. Appl. No. 16/457,287, filed Jun. 28, 2019, entitled: Apparatuses and Methods Involving Disabling Address Pointers. The Examiner is referred to the copending patent prosecution of the common Applicant (no attachment).

U.S. Appl. No. 16/456,206, filed Jun. 28, 2019, entitled: Apparatuses and Methods Involving Synchronization Using Data in the Data/Address Field of a Communications Protocol. The Examiner is referred to the copending patent prosecution of the common Applicant (no attachment).

Non-Final Rejection for U.S. Appl. No. 16/456,111, 15 pgs. (dated Aug. 24, 2020).

IEEE Standard for Ethernet, IEEE 802.3-2018, Clauses 22 and 45 (abstract only).

Open Alliance, TC10 Wake-up and Sleep Specification for Automotive Ethernet.

Yue Lu, Kwangmo Jung, Yasuo Hidaka, Elad Alon, "Design and Analysis of Energy-Efficient Reconfigurable Pre-Emphasis Voltage-Mode Transmitters," in IEEE Journal of Solid-State Circuits, vol. 48, No. 8, Aug. 2013 (abstract only).

Final Rejection for U.S. Appl. No. 16/456,111, 15 pgs., (dated Nov. 30, 2020).

Notice of Allowance for U.S. Appl. No. 16/457,287, 7 pgs. (dated Nov. 27, 2020).

Notice of Allowance for U.S. Appl. No. 16/456,467, 9 pgs. (dated Jan. 22, 2021).

Notice of Allowance for U.S. Appl. No. 16/456,111, 20 pgs. (dated Feb. 19, 2021).

Notice of Allowance for U.S. Appl. No. 16/457,287, 6 pgs. (dated Mar. 3, 2021).

* cited by examiner

APPARATUSES AND METHODS INVOLVING A SEGMENTED SOURCE-SERIES TERMINATED LINE DRIVER

OVERVIEW

Aspects of various embodiments are directed to a line driver having a plurality of source-series terminated driver segments.

In a source-series terminated (SST) driver, multiple voltage-reference levels are selectively connected via a series termination resistance to an output node and via switches. The SST driver allows for low power consumptions, as compared to a current mode driver. SST drivers may handle rail-to-rail output voltage, as the switches are in the output stage and no current sources or transistors need to stay saturated. For example, the output signals may go outside the supply rails so long as the diodes and protection devices are not triggered. Rail-to-rail output voltage may occur with applications with full-duplex communications.

These and other matters have presented challenges to efficiencies of SST segmented line driver implementations, for a variety of applications.

SUMMARY

Various example embodiments are directed to issues such as those addressed above and/or others which may become apparent from the following disclosure concerning a line driver having a plurality of source-series terminated (SST) driver segments.

In certain example embodiments, aspects of the present disclosure involve a line driver used to drive a transmission link by each of the SST driver segments selectively switching among at least two to three voltage-reference levels to drive an output node.

In a more specific example embodiment, an apparatus includes a line driver and an interface circuit. The line driver has a plurality of SST driver segments including switching circuitry to selectively switch among at least three voltage-reference levels to drive an output node, common to each of the SST driver segments, in response to received digital signals by switching at a rate that is faster than a baud rate characterizing the received digital signals. The interface circuit drives a transmission link, in response to a drive signal at the output node, with an analog signal representing an oversampling of the received digital signals.

The apparatus may further include the transmission link and a digital pulse shaping circuit to oversample and filter digital input symbols, wherein the plurality of SST driver segments include three-level SST driver segments and/or two-level SST driver segments. The transmission link may have a first end coupled to the interface circuit and the apparatus further includes another circuit coupled to the transmission link at a second end of the transmission link. The transmission link is coupled to the interface circuit and to another circuit, wherein the transmission link and the other circuit are to communicate in full duplex and/or bi-directionally.

In various embodiments, the apparatus further includes a segment mapping circuit to control switching operations in the line driver. In specific embodiments, the line driver is a differential line driver including a plurality of differential three-level SST driver segments, the switching circuitry to operate at a signal common-mode level to realize differential-zero drive of the plurality of SST driver segments without use of an additional reference voltage, which may be controlled by the segment mapping circuit. In other embodiments, the line driver include a plurality of three-level SST driver segments and another plurality of two-level SST driver segments. The number of SST driver segments that simultaneously drive a mid-level may be controlled and/or programmable. For example, the number of SST driver segments that simultaneously drive a mid-level of the at least three voltage-reference levels may be lower than a total number of the plurality of SST driver segments. In some specific embodiments, the number of SST driver segments that simultaneously drive a mid-level of the at least three voltage-reference levels is set to a maximum number and/or which is set to shape a common-mode impedance variation.

The drive level of each or a subset of the plurality of SST driver segments is selected by two input bits, and simultaneous transitions of the two input bits in one of the plurality of SST driver segments is mitigated. For example, the drive level of each of the plurality of SST driver segments is selected by two input bits, where a first bit of the two input bits selects whether a respective driver segment of the plurality of the SST driver segments drives a mid-level, and a second bit selects driving a high-level or a low-level when the mid-level is not selected. The segment mapping circuit may control switching operations in the line driver, the segment mapping circuit including a map that translates digital input values to segment drive selections, to mitigate two bits of each of the plurality of SST driver segments changing simultaneously. The segment mapping circuit is to use information indicative of a current state and intended driver output level to decompose transitions and map the decomposed transitions to the plurality of SST driver segments to mitigate simultaneously switching input bits on the plurality of SST driver segments. In some specific embodiments, the line driver is coupled to a media-dependent interface, the respective line driver being associated with one of a plurality of logic nodes in a local area network.

A number of embodiments are directed to methods of using the above-described apparatuses. An example method includes selectively switching, via switching circuitry of a line driver having a plurality of SST driver segments, among at least three voltage-reference levels to drive an output node, that is common to each of the plurality of SST driver segments, in response to received digital signals by switching at a rate that is faster than a baud rate characterizing the received digital signals. The method further includes driving a transmission link, via an interface circuit and in response to a drive signal at the output node, with an analog signal representing an oversampling of the received digital signals. The method may further includes controlling a number of SST driver segments that simultaneously drive a mid-level of the at least three voltage-reference levels to be lower than a total number of the plurality of SST driver segments. Additionally, the method includes selecting a drive level of each of the plurality of SST driver segments using two input bits, where a first bit of the two input bits selects whether a respective of the plurality of the SST driver segments drives a mid-level, and a second bit selects driving a high-level or a low-level when the mid-level is not selected.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which.

Figure 1:
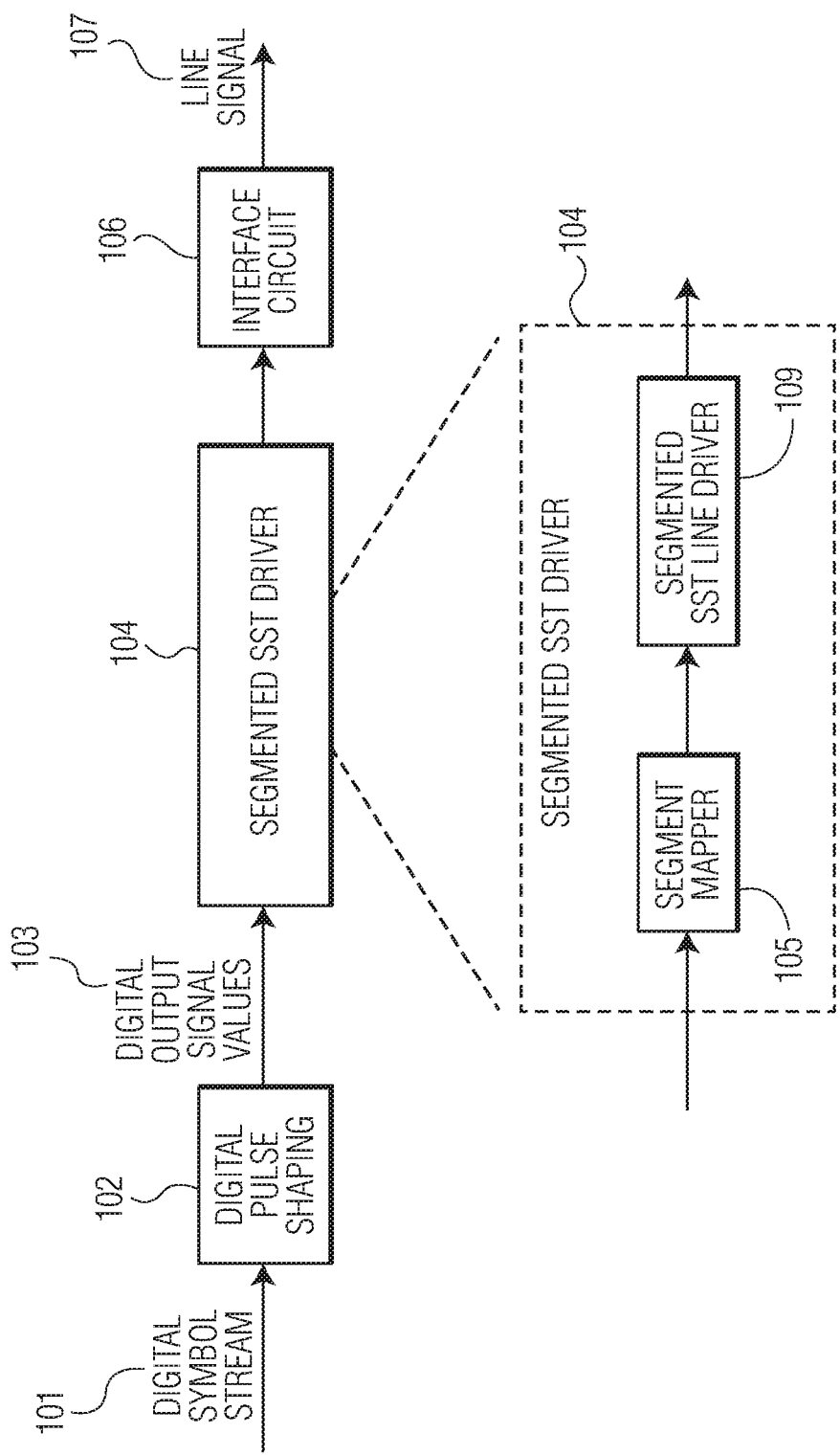
FIG. 1 illustrates a transmit path of an apparatus having a line driver, in accordance with the present disclosure.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving line drivers with a plurality of source-series terminated (SST) driver segments. In certain implementations, aspects of the present disclosure have been shown to be beneficial when used in the context of a line driver used to drive a transmission link by each of the SST driver segments selectively switching among at least two to three voltage-reference levels to drive an output node. While not necessarily so limited, various aspects may be appreciated through the following discussion of non-limiting examples which use exemplary contexts.

Accordingly, in the following description various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

SST driver technology may be used for power efficient line drivers in various applications, with a driver switching at baud-rate. In the SST-based driver, multiple voltage-reference levels are selectively connected via a series termination resistance to the output. The SST driver may be segmented to additionally realize Digital-to-Analog conversion (DAC) functionality in the line driver at low power consumption. Each segment drives with one of the voltage-reference levels at a time, which may include two or three voltage-reference levels in some examples. When the outputs of multiple segment outputs are connected, the resistors provide an interpolation network, such that the resulting driver output level is the weighted average of the individual segment drive levels. Intermediate output voltages can be realized by driving different voltage-reference levels with different segments. For example, with a driver comprising N equal two-level driver segments, N+1 different output levels can be realized, by varying the number of segments that drive high versus the number of segments that drive low. Embodiments in accordance with the present disclosure include a line driver having a plurality of SST segments, at least some of which are three-level SST driver segments. The segments are in an oversampled transmitter to realize DAC and line driver functionality for full-duplex wireline transceivers. When driving small signal levels, three-level driver segments allow substantial power saving compared to two-level driver segments.

Line driver embodiments in accordance with the present disclosure may further bind the signal dependent common-mode impedance variation by setting a maximum number of three-level segments that may drive a mid-level. Furthermore, the line driver embodiments may reduce common mode output noise and avoid or mitigate cross-currents in driver segments. The differential output impedance of the line driver is constant if the number of active driver segments is constant, and driver segment properties do not change. The number of active driver segments may be adapted to calibrate for optimal driver output impedance. For example, when driving a line with impedance Rt, the driver impedance Rd may become equal Rt. Similarly, for a differential line driver, 2Rd may become close to 2Rt.

In various embodiments, one or more of the segments is a three-level driver segment that contains a third switch path for connecting a series resistor to a voltage-reference level in the middle range between the high and low voltage-reference levels. Three-level SST driver segments allows for reduction in power with respect to two-level SST driver segments when driving voltage-reference levels in between extremes. For example, the power efficiency of a segmented two-level SST driver may be compromised when driving output voltages in the middle of the range, because roughly one half of the segments drive high and the other half drive low, providing a current path from the high voltage-reference level to the low voltage-reference level with 2Rd resistance. Using the third drive segment level in the middle between the high and low voltage-reference levels may involve low-impedance third voltage-reference levels for a segmented SST driver.

A specific example apparatus includes a line driver and an interface circuit. The line driver has a plurality of SST driver segments including switching circuitry to selectively switch among at least three voltage-reference levels to drive an output node, common to each of the SST driver segments, in response to received digital signals by switching at a rate that is faster than a baud rate characterizing the received digital signals. The interface circuit drives a transmission link, in response to a drive signal at the output node, with an analog signal representing an oversampling of the received digital signals.

The apparatus may further include the transmission link and a digital pulse shaping circuit to oversample and filter digital input symbols, wherein the plurality of SST driver segments include three-level SST driver segments and/or two-level SST driver segments. For example and in a specific embodiment, the line driver includes a plurality of three-level SST driver segments and another plurality of two-level SST driver segments.

The apparatus further includes a segment mapping circuit to control switching operations in the line driver. The number of SST driver segments that simultaneously drive a mid-level may be controlled and/or programmable. For example, the number of SST driver segments that simultaneously drive a mid-level of the at least three voltage-reference levels may be set to a maximum number and/or which is set to shape a common-mode impedance variation.

The drive level of each of the three-level SST driver segments may be selected by two input bits, and two-level driver segments are selected by one input bit. Simultaneous transitions of the two input bits in one of the plurality of SST driver segments is mitigated. For example, the segment mapping circuit may mitigate two bits of each of the plurality of SST driver segments changing simultaneously by using information indicative of a current state and the intended driver output level to decompose transitions and map the decomposed transitions to the plurality of SST driver segments to mitigate simultaneously switching input bits on the plurality of SST driver segments.

Turning now to the figures, FIG. 1 illustrates a transmit path of an apparatus having a line driver, in accordance with the present disclosure. The apparatus may include a line driver 104 and interface circuit 106.

Figure 2:
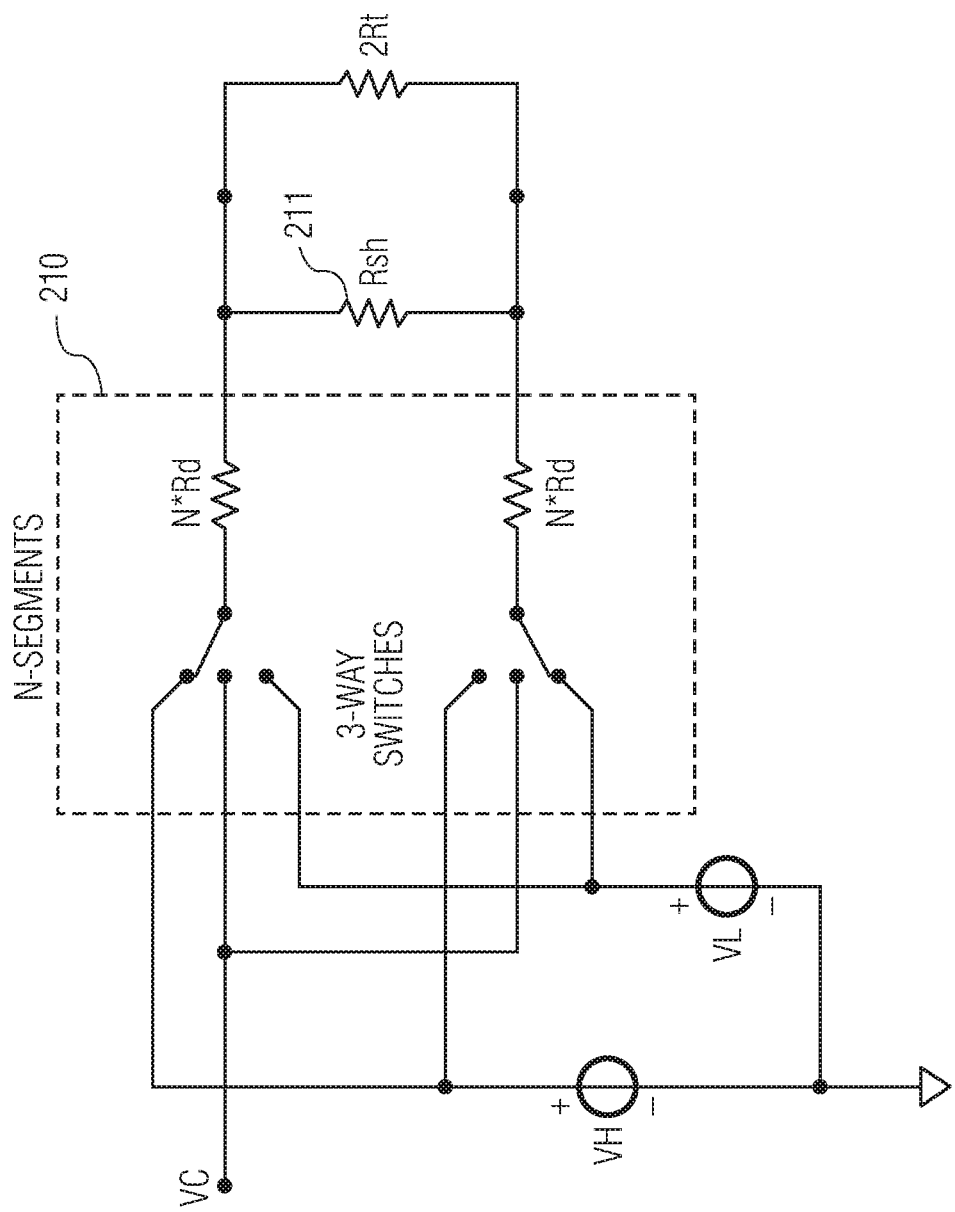
FIG. 2 illustrates an example of a line driver, in accordance with the present disclosure.

The line driver 104 includes the segmented SST line driver 109 having a plurality of SST driver segments and switching circuitry, and as further illustrated by FIG. 2. The switching circuitry selectively switches the SST driver segments among different voltage-reference levels to drive an output node that is common to each of the SST driver segments. For example, each of the SST driver segments may switch between two voltage-reference levels and/or three voltage-reference levels, and the segmented SST line driver 109 includes N different driver segments. The outputs of the N driver segments are connected and the resulting driver output level is the weighted average of the individual segment drive levels. Intermediate voltage may be achieved by driving different voltage-reference levels with different segments. For example, varying the number of segments that drive between the two or three voltage-reference levels (e.g., high and low or high, low, and mid voltage levels) is used to provide the output that is an intermediate voltage (e.g., between the high level and the low level). Each segment includes switching circuits, and the settings of the plurality of switching circuits may drive the voltage level on the output node to a plurality of different voltage-reference levels. The switching circuitry may selectively switch the driver segments between the two or more voltage-reference levels in response to received digital signals by switching at a rate that is faster than a baud rate characterizing the received digital signals.

The interface circuit 106, in response to a drive signal at the output node, drives the transmission link (e.g., with the line signal 107) with an analog signal representing an oversampling of the received digital signals. The interface circuit 106 includes or refers to a circuit that provides an interface to another circuit. The transmission link may be a cable and the interface circuit is a media-dependent interface (MDI) that connects to the media (e.g., cable). Although embodiments are not so limited and the interface circuit 106 may include other types of interfaces.

The plurality of SST driver segments may include three-level SST segments having a high voltage-reference level, a mid voltage-reference level, and a low voltage-reference level, sometimes herein referred to as voltage levels and/or high-level, mid-level, and low-level. In some embodiments, all of the SST driver segments include three-level SST segments. In other embodiments, the SST driver includes a mixture of two-level SST segments (e.g., high voltage level and low voltage level) and three-level SST segments. The line driver may be a differential line driver including a plurality of differential three-level SST driver segments, the switching circuitry to operate at a signal common-mode level to realize differential-zero drive of the plurality of SST driver segments without use of an additional reference voltage. The differential-zero drive is associated with the mid voltage-reference level, as further described herein. In various embodiments, the line driver 104 a plurality of SST segments and segmented shunt paths, as further described herein.

The line driver 104 further includes a segment mapping circuit 105. The segment mapping circuit 105 controls switching operations in the segmented SST line driver 109. As provided above, a subset or all of the plurality of SST driver segments may include three-level SST segments. The number of SST driver segments that are allowed to drive a mid-level of the (at least) three-voltage reference levels may be lower than the total number of the plurality of SST driver segments, and which may be controlled by the segment mapping circuit 105. For example, the number of SST driver segments that simultaneously drive a mid-level of the at least three voltage-reference levels is set to a maximum number, and which may be programmable. Furthermore, the number of the plurality of SST driver segments that simultaneously drive a mid-level of the at least three voltage-reference levels is set to shape a common-mode impedance variation.

The drive level of each of the plurality of SST driver segments is selected by one or two input bits. For two-level segments, one input bit is used. For three-level segments, two input bits are used. For example, a drive level of each or a subset of the SST driver segments is selected, such as by the segment mapping circuit 105, by the two input bits and such that simultaneous transitions of the two input bits in one of the plurality of SST driver segments is mitigated. A first bit of the two input bits selects whether a respective of the plurality of the SST driver segments drives a mid-level, and a second bit selects driving a high-level or a low-level when the mid-level is not selected. For two-level segments, the one bit selects the high-level or the low-level.

Figure 5:
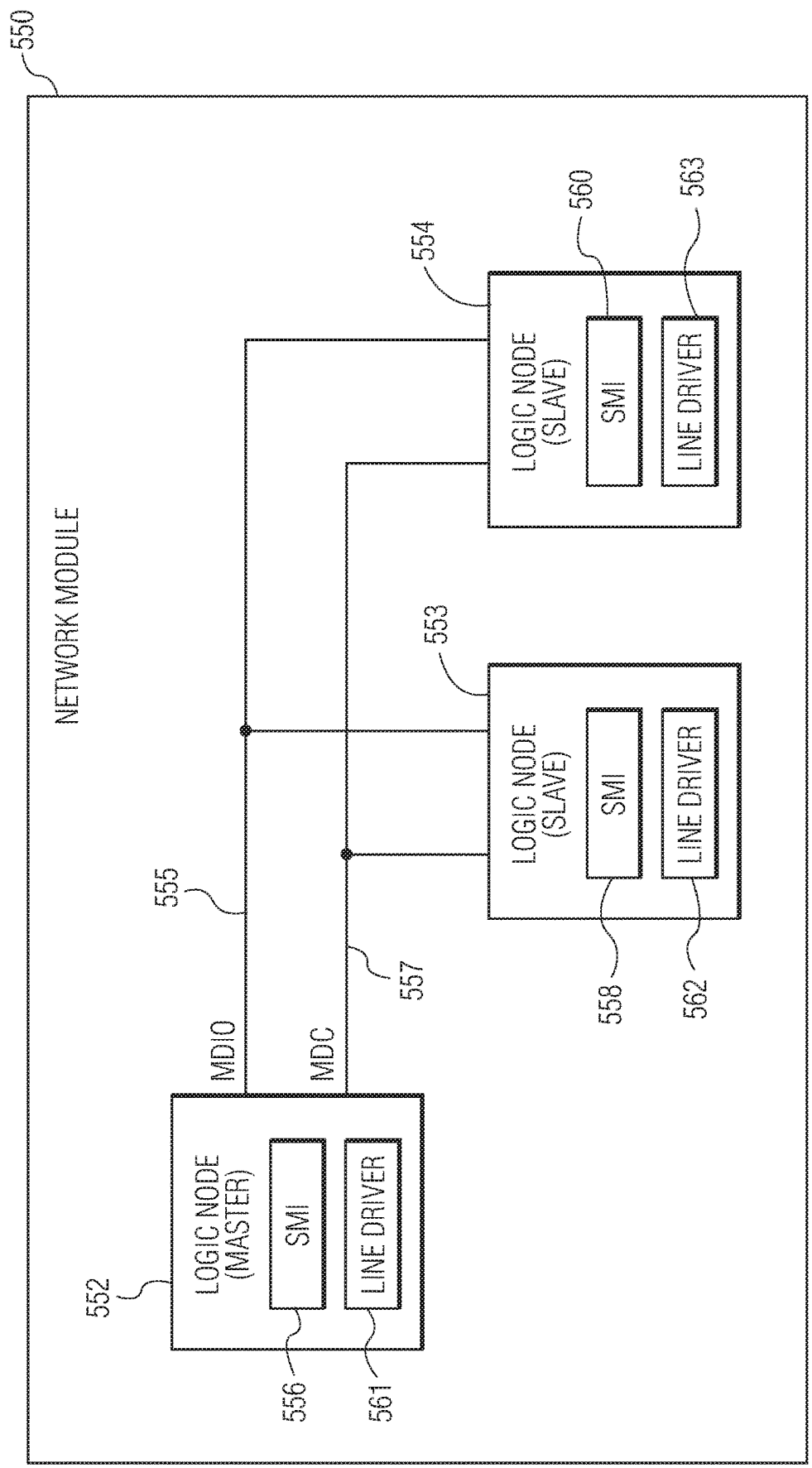
FIG. 5 illustrates a specific example apparatus having multiple line drivers coupled to a transmission link, in accordance with the present disclosure.

The segment mapping circuit 105 may include a map that translates digital input values to segment drive selections. The map is used to mitigate or prevent two input bits of each of the plurality of SST driver segments changing simultaneously. For example, the map mitigates or prevents segment drive transitions from the high-level to the mid-level directly followed by a transition from the mid-level to the low-level in the next cycle and segment drive transitions from low-level to mid-level directly followed by a transition from mid-level to high-level in the next cycle. The segment mapping circuit 105 may use information indicative of a current state and intended driver output level to decompose transitions and map the decomposed transitions to the plurality of SST driver segments to mitigate simultaneously switching input bits on the plurality of SST driver segments The apparatus may include additional circuitry, such as circuits of the below described transmit path. As a specific example, the apparatus may further include the transmission link and/or a digital pulse shaping circuit 102 to oversample and filter the digital input symbols 101. The transmission link may have a first end coupled to the interface circuit 106 and another circuit coupled to the transmission link at a second end of the transmission link. For example, the transmission link is coupled to the interface circuit 106 and the apparatus further includes another circuit coupled to the transmission link, wherein the transmission link and the other circuit are to communicate in full duplex. In other examples and/or in addition, the transmission link is coupled to the interface circuit 106 and the apparatus further includes another circuit coupled to the transmission link, wherein the transmission link and the other circuit are to communicate bi-directionally. In specific embodiments, such as illustrated by FIG. 5, the line driver 104 is part of a physical layer (PHY) device or sub-system used to drive a cable via an MDI interface.

The line driver 104 is typically part of a transmit path. An example of such a transmit path is shown by FIG. 1. The transmit path of a transceiver may consists of digital pulse-shaping, a DAC, a line driver, and analog filtering. The digital pulse shaping circuit 102 can provide upsampling of the symbol stream to the DAC sample rate as well as convolution with a certain transmit pulse shape, for example, to limit signal bandwidth (e.g., resulting in the digital output signals 103). Sharp cut-off filtering can be achieved by using raised-cosine pulses as the transmit pulse shape. The line driver 104 provides both the DAC and line driver functionalities. Some analog post filtering after the line driver 104 may be used to suppress quantization noise, by the analog filter between the segmented SST line driver 104 and the interface circuit 106 that couples to the transmission link. If the driver 104 is sufficiently oversampled with respect to the symbol rate, smooth pulse shapes can be driven to the line and the analog post-filtering can be limited. Some filtering may be achieved on the output from circuit and package parasitics. Additional output signal filtering with limited impact on return loss can be accomplished by splitting the series termination resistor in the segments in parts and adding some capacitance at the tap point, such as illustrated by the example segments in FIG. 3.

Embodiments in accordance with the present disclosure are directed to line drivers that realize DAC functionality in the line driver, allow for oversampled digital pulse shaping. The SST line driver includes three-level driver segments which may be used in a transmitter for a full-duplex communication link.

FIG. 2 illustrates an example of a line driver, in accordance with the present disclosure. As shown, the line driver has a plurality of driver segments 210 (e.g., N segments). In FIG. 2, the illustrated line driver is a differential driver.

In a differential driver, the driver segments consist of two single-ended sub-drivers, which drive opposite values (e.g., high-level and low-level). In the differential driver segments, an additional third level, e.g., the mid-level, can be accomplished by connecting the positive and negative output via a shunt resistance with value 2× Rd. This is shown in FIG. 2 with a third switch path to voltage Vc. The additional third drive level of a differential driver segment corresponds with driving differential zero. Because there is no net current flowing to or from this third reference voltage of the driver segment, the extra reference voltage may not use a voltage source. The voltage Vc automatically tracks the midpoint between high and low drive levels.

As previously described, each of the driver segments 210 may drive with one of the corresponding voltage-reference levels at a time, which include three-levels in the specific example of FIG. 2. The outputs of the plurality of driver segments 210 are connected, and the resistors provide an interpolation network, such that the resulting driver output level is the weighted average of the individual segment drive levels. Intermediate voltages are realized by driving different levels with different segments, such as varying the number of segments that drive high, low, and mid voltage-reference levels.

The output voltage range of the differential segmented SST driver, as shown by FIG. 2, is ±(VH−VL)*Rt/(Rd+Rt), which equals ±(VH−VL)/2 when Rd=Rt. The reference voltages of the high voltage-reference level (VH) and the low voltage-reference level (VL) may source and sink current, and therefore low-impedance source voltages are used for such voltage-reference levels, preferably using already available and suitable supply voltages. The output signal range may not necessarily match with the reference voltage levels, e.g., (VDD−VSS)/2. The output voltage swing can be reduced with an additional resistive shunt path 211 between the output pins. In order to avoid or mitigate the additional shunt path 211 reducing the output impedance of the line driver, the net output resistance of active driver segments 210 may be scaled up, such that 2Rd//Rsh=2Rt. A line driver may be designed for driving a certain maximum amplitude that is a fixed fraction of the provided reference supply voltages. Alternatively, it may be made scalable by making the effective impedance of both the shunt path and active driver segments programmable. This can, for example, be accomplished by segmenting the shunt path in multiple parallel paths and changing the number of active driver segments and enabled shunt segments such that a desired (e.g., threshold) effective output impedance is maintained. Scaling the number of active segments allows for counteracting process spread of resistor values. The segment mapping circuit illustrated by FIG. 1 may take the actual number of active driver segments into account for mapping.

Various embodiments are directed to reducing the impact of common mode impedance variation if there is a common-mode tap point available in the differential-zero path of the driver segment and the driver shunt path of the line driver. Such a common-mode tap point can be decoupled. Decoupling can be considered on-chip or off-chip. However, this may involve using two switches instead of one in these paths. The switches in these paths operate at the signal common-mode level and therefore typically have less gate drive. There are typically two switches and each is double the size, quadrupling the total size of these switches and their parasitic impact. Alternatively, the gate drive of the switches operating at the signal common-mode level may be boot-strapped.

Figure 3:
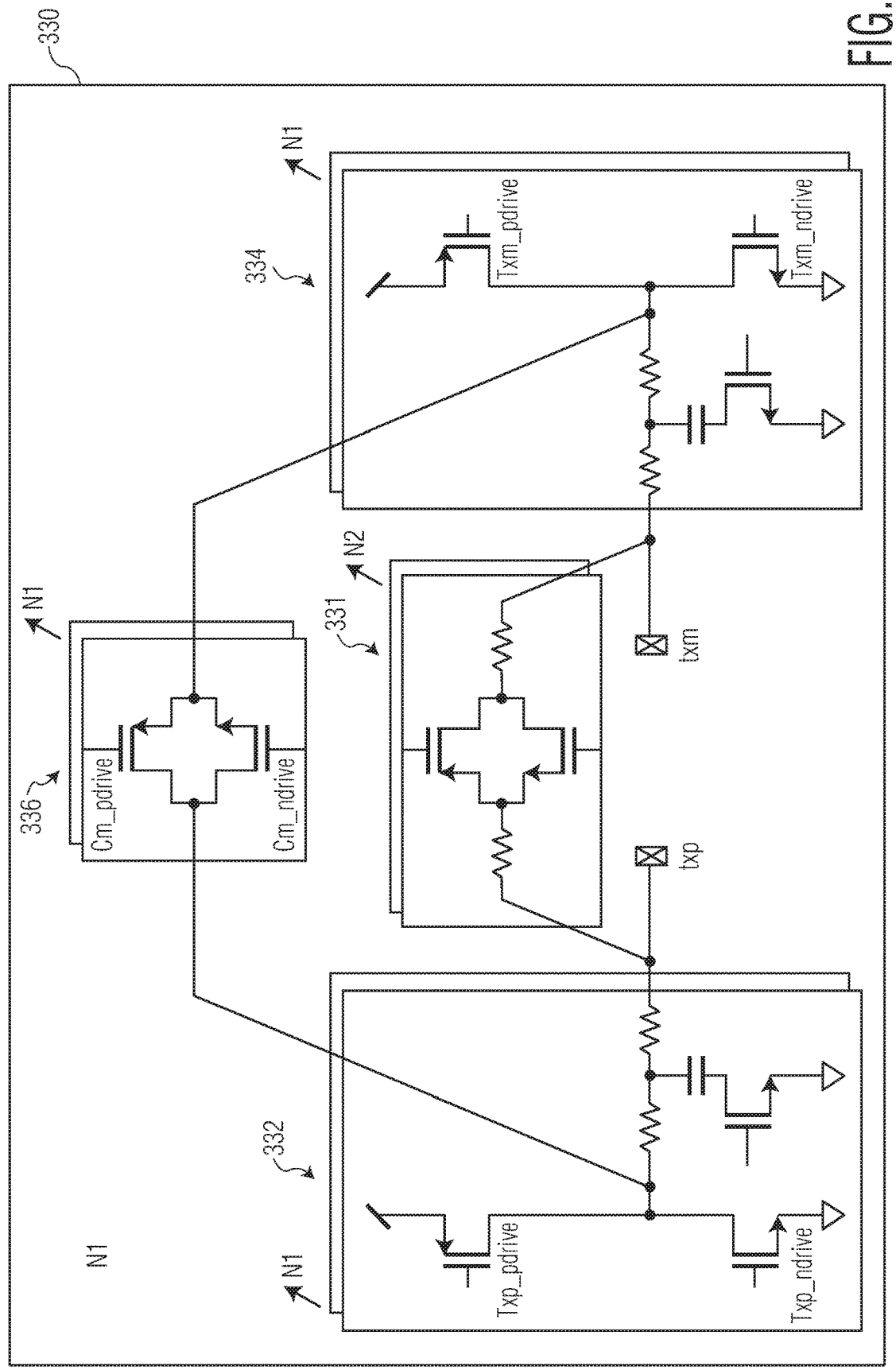
FIG. 3 illustrates another example line driver, in accordance with the present disclosure.

FIG. 3 illustrates another example line driver, in accordance with the present disclosure. More specifically, FIG. 3 illustrates an example transistor level diagram of a three-level SST driver 330 with a plurality of SST segments and segmented shunt paths 331.

In each segment (as represented by N1, which is the number of driver segments), drive paths 332, 334 are associated with the high-level, low-level, and the mid-level may be each implemented with a PMOS and an NMOS sharing a single series resistor. Both drive paths 332, 334 may be involved in driving differential high and low, with path 332 driving high and path 334 driving low to achieve the high-level and the path 332 driving low and path 334 driving high to achieve the low-level. The drive-zero paths 336 associated with the mid-level may be implemented with a pass-gate here. Note that both the drive-zero paths 336 in the segments and the shunt paths 331 of the line driver include a single switch (pass-gate) per leg, instead of two in series. This may reduce switch sizes, particularly for switches that operate at the signal common-mode level. However, there may be no explicit common-mode voltage tap point available and the common-mode voltage may not be easily decoupled. As transistor switches have a non-zero resistance, the segment output impedance is determined by the series connection of the resistor and a switch. These are dimensioned such that the total resistance matches the threshold (e.g., desired) value and that all paths provide almost equal resistance.

Each of the segments may include two-levels, three-levels or the plurality of segments may include a mixture of two-levels and three-levels. When using two-level SST segments, the power may be signal dependent and the Vdd may be independent of the peak current. For example, a zero differential voltage (Vtx) of zero, the current doubles with two-level SST segments. In a full-duplex transmission link (e.g., bidirectional), the supply current also depends on the signal from the link partner. As this dependency is linear, it averages out if symbol streams are balanced and uncorrelated. When using three-level SST segments, the power may be signal dependent and when Vtx is zero, current is zero. At zero differential voltage, the line driver may not need to deliver current and the power consumption approaches zero. In a full-duplex link, the supply current also depends on the signal from the link partner but as this dependency is linear it should average out if symbol streams are balanced and uncorrelated.

The power saving for lower amplitudes may be useful when the line driver often drives lower amplitude levels. This may happen, for example, when the signal transitions slowly due to transmitter low-pass filtering to suppress the out-of-band spectrum. Furthermore, lower amplitude levels occur more often when driving symbols that can take more than two levels. For example, a pulse-amplitude modulation 3 (PAM3) scheme uses a third differential-zero output level, which can be accomplished using the line driving having at least some three-level driver segments as described above. Higher level PAM and quadrature amplitude modulation (QAM) schemes may also use three-level driver segments, as the output voltage amplitude are lower than the extreme for a significant part of the time. Some transmission schemes additionally support a differential zero level even when this is not part of the symbol scheme during transmission, for example during start-up or for power saving states. Three-level driver segments may be used to achieve this.

In some embodiments, the apparatuses include a plurality of two-level SST driver segments and three-level driver SST segments. Three-level driver segments may not provide a constant common-mode output impedance independent of transmitted output level. The additional third path in three-level differential driver segments may not deliver current and only keeps differential impedance constant. The common-mode impedance of such a driver varies with the number of driver segments that drive differential zero. As the number of segments driving the differential zero increases for lower output signal magnitude, the common-mode impedance increases for lower output signal amplitude and becomes very high for a zero-differential output level. Although common-mode is not always explicitly specified by standards, embodiments may include avoiding or mitigating having a high common-mode impedance and the line driver may become vulnerable to common-mode interference on the communication channel. Accordingly, the number of driver segments allowed to drive differential-zero at any time may be limited to a certain maximum, and in response, the maximum common-mode impedance becomes bounded. An example maximum value includes half of the number of active segments driving differential-zero. In such an example, the supply current for driving a zero-differential output level becomes equal to the required current when driving the extreme magnitude values.

Setting the maximum number of segments that drive differential-zero simultaneously may be used to control the maximum common-mode output impedance. When smoothly transitioning from a high differential value to zero, a subset of the driver segments switch from drive-high to drive-zero (e.g., mid-level) until the maximum number of segment driving differential-zero is reached. From that point onwards, additional segments switching from drive-high to drive-zero are compensated by switching respective segments that are already driving-zero to drive-low.

In various specific embodiments, for PAM3 signaling, it is possible to select the maximum number of segments driving differential-zero such that the static current at the nominal symbol levels is constant. The static supply current is not flat over the whole output range and may show dips between the nominal PAM3 levels. Further, in related and more specific embodiments, the three-level segments are driven in such a way that the direct current (DC) supply current remains constant for any output level. As a specific example, a constant DC current for the static levels for a PAM scheme may be applied.

The line driver may consume additional power in the pre-driver during transitions. In various embodiments, the maximum number of segments driving differential-zero is selected such that the combination of driver and pre-driver power becomes roughly constant.

A number of embodiments are directed to alternative techniques to bind common-mode output impedance. For example, the static supply current can be made flat over the full drive range, or by approximating any other smooth supply current characteristics across the signal range that fit the minimum limit set by three-level driver segments but avoid the zero-current notch for a differential-zero output level. Examples of this are quadratic or quartic supply current curves, that obey the three-level segment driver current limit and reduce the power for a differential-zero output level substantially, while circumventing the zero-current notch. Smooth supply current curves can be beneficial to reduce harmonic spurs in the supply current during operation.

Figure 4:
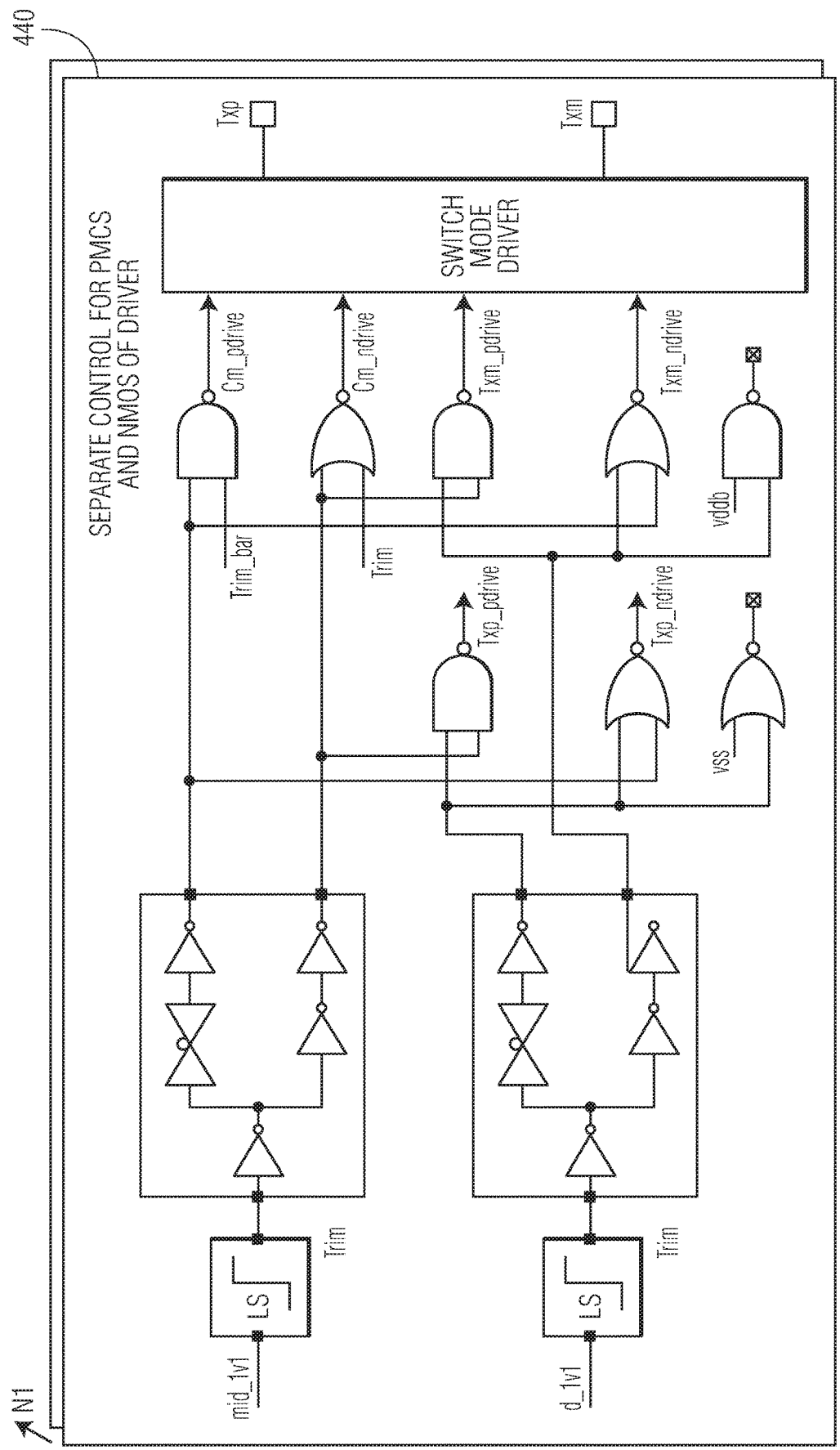
FIG. 4 illustrates an example of a three-level SST driver segment and the input bits for controlling the same, in accordance with the present disclosure.

FIG. 4 illustrates an example of a three-level SST driver segment and the input bits for controlling the same, in accordance with the present disclosure. For driving more than two levels, two input bits may be used.

As a specific example, the three-level driver segments, such as the illustrated segment with input bits 440, use two input bits, each to select one of three drive levels. A two-level driver segment may use one input bit. Simultaneous switching of these two input bits may cause cross currents which are problematic for emissions, power consumption, and power supply integrity. To avoid cross-currents in the line driver having three-level driver segments, the switches implement a break-before-make scheme. Furthermore, the input bits encoding and segment mapping are selected such that the two segment input bits do not change simultaneously. For example, one of the segment input bits may encode if the segment drives a zero or non-zero level, while the other input bit encodes if the segment drives high or low when the first bit selects a non-zero level. Changing a driver segment from drive high to drive low (and vice versa) via the mid-level includes three steps: 1) drive zero through "mid 1v1" input bit of segment, 2) swap drive polarity of "d 1v1" input bit while driving zero, and 3) drive non-zero through swapping polarity of "mid 1v1". These steps per segment are computed on-the-fly by the segment mapping circuit, while the line driver is transitioning through its output voltage range. This requires consideration of current state and upcoming desired drive levels to avoid transition conflicts. This sets a limit to how fast the signal can change from one sample to the next, however, with a sufficiently high sample rate and input low-pass filtering and this can be resolved. If this does not provide sufficient freedom for mapping, additionally, driver segments may switch directly from high to low (or vice versa).

Although the above describes the SST driver segments as being equal, embodiments are not so limited, and may include line drivers comprising un-equal driver segments. SST driver segments may be differently dimensioned. Furthermore, a line driver may contain both two-level and three-level SST driver segments. Two-level segments are simpler, and not all driver segments may need to be able to drive three-levels. In some embodiments, three-level driver segments may be used as two-level driver segments if the mid-level is disabled or not used for the input code to segment drive mapping.

FIG. 5 illustrates a specific example apparatus having multiple line drivers coupled to a bus, in accordance with the present disclosure. In various embodiments, the above described drivers may be used in a local area network (LAN) to drive a management communication bus. For example, the above described apparatus of FIG. 1 may be for use in a LAN that is characterized by a plurality of network modules that convey data over a physical communication channel via a communications protocol. One or more of the network modules may consist of multiple devices and has a management communications bus for communication among a plurality of logic nodes via a communications protocol within the respective module. The communications protocol is compliant with an industry standard that defines an Ethernet-based LAN technology.

The network module 550 includes a plurality of logic nodes 552, 553, 554 and a management communication bus 555, 557 for communication among the plurality of logic nodes 552, 553, 554 in response to communications set over the management communications bus 555, 557. The management communications bus 555, 557 includes two lines, a clock line and data line, respectively referred to as the management data clock (MDC) 557 and the management data input/output (MDIO) 555. MDC 557 provides a full-rate clock signal from the (master) logic node 552 to the (slave) logic nodes 553, 554 to drive and slice bits on MDIO 555 during frames. The clock signal may stop during idle. MDIO 555 is a bi-directional bus with a tri-state line driver in each logic node 552, 553, 554 and restive pull-up on the bus.

In some of embodiments, two different types of logic nodes are connected to the management communications bus 555, 557, namely, slave logic nodes 553, 554 and a master logic node 552 and which each include interfaces, e.g., serial management interface (SMI) and/or controller 556, 558, 560 and MDI. The master logic node 552 generates the clock and initiates communications with the slave logic nodes 553, 554. Although a single master logic node 552 and two slave logic nodes 553, 554 are illustrated, embodiments are not so limited and can include additional logic nodes or fewer logic nodes. The master logic node 552 is typically a micro-controller (e.g., the SMI controller 556) and is called a station management entity (STA) in the IEEE specification. The slave logic nodes 553, 554 are typically Ethernet PHYs, however SMI may also be used to manage other types of devices. The slave logic nodes have an internal bus to couple internal PHYs and communicate over the management communications bus via an internal SMI controller 558, 560, which is a function internal to a slave logic node that translates SMI transactions to internal register transactions.

One or more of the plurality of logic nodes 552, 553, 554 may include a PHY or multiple PHYs that connect to the data link layer, such as the medium access control (MAC) layer via a media independent interface (MII). A PHY may be a chip, which may include one or multiple PHYs. Larger chips may contain one or more PHY subsystems, each including one or more PHYs. A PHY includes or refers to an individual chip or circuit, as a part of a circuit assembly, or a subsystem (e.g., circuit) of a device (e.g., an SMI slave device having multiple PHYs, such as an IC). The PHYs are configured to implement physical layer functions. Each PHY has its own port address, and, in some embodiments, multiple PHYs are integrated into one device and/or a slave logic node (and/or, optionally, with multiple logic nodes on a device) having one shared SMI interface. Each PHY includes a physical coding sublayer (PCS), a physical media attachment layer (PMA) and/or a physical media dependent layer (PMD), as well as the MDI that connects to the media (e.g., cable) and which is driven by the segmented SST line drivers 556, 558, 560. The PMD is an interface between the PMA and the transmission medium through the MDI. The PMD receives serialized bits from the PMA and converts to the appropriate signals for the transmission medium (such as optical signals for a fiber optic line or electrical signals for a copper line). When transmitted to the PMA, the PCS encodes the data to be transmitted into the appropriate code group. When receiving the code groups from the PMA, the PCS decodes the code groups into the data format that can be understood and processed by upper layers. The MII carries signals between the physical layer and the data link layer, such as to a MAC controller. The MII may include a reduced media-independent interface (RMII), gigabit media independent interface (GMII), a reduced gigabit media independent interface (RGMII), serial gigabit media-independent interface (SGMII), quad serial gigabit media-independent interface (QSGMII), and 10-gigabit media-independent interface (XGMII), among others.

Each of the logic nodes have the segmented SST line drivers 561, 562, 563 used to drive a cable via the MDI interface. Although embodiments are not limited to an MDI interface and/or the above described cable in a LAN, and may be implemented using other types of interfaces and/or transmission links. Furthermore, although the embodiments illustrate that the logic nodes include one segmented SST line drivers, embodiments are not so limited and one or more logic nodes includes a plurality of segmented SST line driver. For example, logic nodes may include multiple PHYs and has a segmented SST line driver per PHY.

A number of embodiments are directed to methods of using the above-described apparatuses. An example method includes selectively switching, via switching circuitry of a line driver having a plurality of SST driver segments, among at least three voltage-reference levels to drive an output node, that is common to each of the plurality of SST driver segments, in response to received digital signals by switching at a rate that is faster than a baud rate characterizing the received digital signals. The method further includes driving a transmission link, via an interface circuit and in response to a drive signal at the output node, with an analog signal representing an oversampling of the received digital signals. The method may further includes controlling a number of SST driver segments that simultaneously drive a mid-level of the at least three voltage-reference levels to be lower than a total number of the plurality of SST driver segments. Additionally, the method includes selecting a drive level of each of the plurality of SST driver segments using two input bits, where a first bit of the two input bits selects whether a respective of the plurality of the SST driver segments drives a mid-level, and a second bit selects driving a high-level or a low-level when the mid-level is not selected.

Various embodiments are implemented in accordance with the underlying U.S. patent application (application Ser. No. 16/456,111 entitled "Apparatuses and Methods Involving First Type of Transaction Registers Mapped to Second Type of Transaction Addresses," filed Jun. 28, 2019, which is fully incorporated herein by reference for its general and specific teachings. For instance, embodiments herein and/or in the provisional application may be combined in varying degrees (including wholly). As a specific example, the above-described apparatuses and/or methods may include first type of transaction registers that are mapped to the second type of transaction addresses, such as illustrated by FIGS. 2A-2B and 4. Embodiments discussed in the patent application are not intended, in any way, to be limiting to the overall technical disclosure, or to any part of the claimed disclosure unless specifically noted.

The skilled artisan would recognize that various terminology as used in the Specification (including claims) connote a plain meaning in the art unless otherwise indicated. As examples, the Specification describes and/or illustrates aspects useful for implementing the claimed disclosure by way of various circuits or circuitry which may be illustrated as or using terms such as blocks, modules, device, system, unit, controller, and/or other circuit-type depictions (e.g., reference numerals 106 of FIG. 1 depict a block/module as described herein). Such circuits or circuitry are used together with other elements to exemplify how certain embodiments may be carried out in the form or structures, steps, functions, operations, activities, etc. For example, in certain of the above-discussed embodiments, one or more modules are discrete logic circuits or programmable logic circuits configured and arranged for implementing these operations/activities, as may be carried out in the approaches shown herein. In certain embodiments, such a programmable circuit is one or more computer circuits, including memory circuitry for storing and accessing a program to be executed as a set (or sets) of instructions (and/or to be used as configuration data to define how the programmable circuit is to perform), and an algorithm or process as described herein is used by the programmable circuit to perform the related steps, functions, operations, activities, etc. Depending on the application, the instructions (and/or configuration data) can be configured for implementation in logic circuitry, with the instructions (whether characterized in the form of object code, firmware or software) stored in and accessible from a memory (circuit).

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps. For instance, the line drivers illustrated herein may be used to implement the method described herein and/or may form part of the network module as illustrated by FIG. 5. As another example, the line driver having the three-level SST segment illustrated by FIG. 2 may include one or more segments that are two-level SST segments. Such modifications do not depart from the true spirit and scope of various aspects of the disclosure, including aspects set forth in the claims.

What is claimed is:

1. An apparatus comprising:
a line driver having a plurality of source-series terminated (SST) driver segments including switching circuitry to selectively switch among at least three voltage-reference levels to drive an output node, common to each of the SST driver segments, in response to received digital signals by switching at a rate that is faster than a baud rate characterizing the received digital signals; and
an interface circuit to drive a transmission link, in response to a drive signal at the output node, with an analog signal representing an oversampling of the received digital signals.

2. The apparatus of claim 1, further including the transmission link and further including a digital pulse shaping circuit to oversample and filter digital input symbols, wherein the plurality of SST driver segments include three-level SST driver segments.

3. The apparatus of claim 1, further including the transmission link having a first end coupled to the interface circuit and further including another circuit coupled to the transmission link at a second end of the transmission link.

4. The apparatus of claim 1, further including the transmission link coupled to the interface circuit and further including another circuit coupled to the transmission link, wherein the transmission link and the other circuit are to communicate in full duplex.

5. The apparatus of claim 1, further including the transmission link coupled to the interface circuit and further including another circuit coupled to the transmission link, wherein the transmission link and the other circuit are to communicate bi-directionally.

6. The apparatus of claim 1, further including a segment mapping circuit to control switching operations in the line driver.

7. The apparatus of claim 1, wherein the line driver is a differential line driver including a plurality of differential three-level SST driver segments, and the switching circuitry is configured to operate at a signal common-mode level to realize differential-zero drive of the plurality of SST driver segments without use of an additional reference voltage.

8. The apparatus of claim 1, wherein a number of SST driver segments that simultaneously drive a mid-level of the at least three voltage-reference levels is lower than a total number of the plurality of SST driver segments.

9. The apparatus of claim 1, wherein a number of SST driver segments that simultaneously drive a mid-level of the at least three voltage-reference levels is set to a maximum number.

10. The apparatus of claim 9, wherein the maximum number is programmable.

11. The apparatus of claim 1, wherein a number of the plurality of SST driver segments that simultaneously drive a mid-level of the at least three voltage-reference levels is set to shape a common-mode impedance variation.

12. The apparatus of claim 1, wherein a drive level of each of the plurality of SST driver segments is selected by two input bits, and simultaneous transitions of the two input bits in one of the plurality of SST driver segments is mitigated.

13. The apparatus of claim 1, wherein a drive level of each of the plurality of SST driver segments is selected by two input bits, where a first bit of the two input bits selects whether a respective one of the plurality of the SST driver segments drives a mid-level, and a second bit selects driving a high-level or a low-level when the mid-level is not selected.

14. The apparatus of claim 1, further including a segment mapping circuit to control switching operations in the line driver, the segment mapping circuit including a map that translates digital input values to segment drive selections, to mitigate two bits of each of the plurality of SST driver segments changing simultaneously.

15. The apparatus of claim 14, wherein the segment mapping circuit is to use information indicative of a current state and intended driver output level to decompose transitions and map the decomposed transitions to the plurality of SST driver segments to mitigate simultaneously switching input bits on the plurality of SST driver segments.

16. The apparatus of claim 1, wherein the plurality of SST driver segments include three-level SST driver segments and the apparatus further include another plurality of two-level SST driver segments.

17. The apparatus of claim 1, wherein the line driver is coupled to a media-dependent interface, the line driver being associated with one of a plurality of logic nodes in a local area network.

18. A method comprising:
selectively switching, via switching circuitry of a line driver having a plurality of source-series terminated (SST) driver segments, among at least three voltage-reference levels to drive an output node, that is common to each of the plurality of SST driver segments, in response to received digital signals by switching at a rate that is faster than a baud rate characterizing the received digital signals; and
driving a transmission link, via an interface circuit and in response to a drive signal at the output node, with an analog signal representing an oversampling of the received digital signals.

19. The method of claim 18, further including controlling a number of SST driver segments that simultaneously drive a mid-level of the at least three voltage-reference levels to be lower than a total number of the plurality of SST driver segments.

20. The method of claim 18, further including selecting a drive level of each of the plurality of SST driver segments using two input bits, where a first bit of the two input bits selects whether a respective of the plurality of the SST driver segments drives a mid-level, and a second bit selects driving a high-level or a low-level when the mid-level is not selected.

* * * * *